United States Patent
You et al.

(10) Patent No.: US 12,376,422 B2
(45) Date of Patent: Jul. 29, 2025

(54) APPARATUS FOR TREATING SUBSTRATE

(71) Applicant: SEMES CO., LTD., Cheonan-si (KR)

(72) Inventors: Jae Hyun You, Cheonan-si (KR); Sang Joon Lee, Cheonan-si (KR); Young Hyo Kim, Cheonan-si (KR); Suk Won Jang, Seoul (KR); Jun Wook Kim, Daegu (KR)

(73) Assignee: SEMES CO., LTD., Cheonan-si (KR)

( * ) Notice: Subject to any disclaimer, the term of this patent is extended or adjusted under 35 U.S.C. 154(b) by 819 days.

(21) Appl. No.: 17/396,422

(22) Filed: Aug. 6, 2021

(65) Prior Publication Data

US 2022/0045233 A1  Feb. 10, 2022

(30) Foreign Application Priority Data

Aug. 6, 2020  (KR) .................... 10-2020-0098447

(51) Int. Cl.
*H10H 20/01*   (2025.01)
*H01L 25/075*  (2006.01)
*H10H 20/857*  (2025.01)

(52) U.S. Cl.
CPC ......... *H10H 20/01* (2025.01); *H01L 25/0753* (2013.01); *H10H 20/857* (2025.01); *H10H 20/0364* (2025.01)

(58) Field of Classification Search
None
See application file for complete search history.

(56) References Cited

U.S. PATENT DOCUMENTS

2008/0289967 A1* 11/2008 Owczarz ......... H01L 21/68707
                                                       205/157
2009/0311434 A1* 12/2009 Inamasu ........... H01L 21/6715
                                                       427/424

FOREIGN PATENT DOCUMENTS

| | | |
|---|---|---|
| JP | 201034382 A | 2/2010 |
| JP | 1011547560000 A | 6/2012 |
| JP | 2015038442 A | 2/2015 |
| JP | 1020177000812 A | 2/2017 |
| JP | 1018011390000 A | 11/2017 |
| JP | 1020180104802 A | 9/2018 |
| JP | 1020861710000 B | 3/2020 |
| KR | 1020100029771 A | 3/2010 |
| KR | 1020130046340 A | 5/2013 |
| KR | 101627365 B1 | 6/2016 |
| KR | 1020190112226 A | 10/2019 |
| KR | 1020200031743 A | 3/2020 |

OTHER PUBLICATIONS

English translation of KR20200031743.*
English translation of JP2015038442A.*

* cited by examiner

*Primary Examiner* — Charles Capozzi
(74) *Attorney, Agent, or Firm* — Procopio, Cory, Hargreaves & Savitch LLP

(57) ABSTRACT

Disclosed is a substrate treating apparatus. The apparatus includes a liquid supply unit for supplying light-emission sources and/or a treating liquid onto the substrate, and a voltage application unit for applying a voltage to the substrate on which the light-emission sources have been supplied.

20 Claims, 10 Drawing Sheets

APPARATUS FOR TREATING SUBSTRATE

CROSS-REFERENCE TO RELATED APPLICATIONS

A claim for priority under 35 U.S.C. § 119 is made to Korean Patent Application No. 10-2020-0098447 filed on Aug. 6, 2021, in the Korean Intellectual Property Office, the entire contents of which are hereby incorporated by reference.

BACKGROUND

Embodiments of the inventive concept described herein relate to an apparatus for treating a substrate.

Recently, a display market has grown as various displays such as CRT, LCD, and OLED have been developed and spread. OLED is leading a small and medium-sized display market. OLED has emerged as a main display for a smartphone because OLED has a simple structure and thus is cheaper compared to LCD, and is flexible. On the other hand, LCD is still leading a large-sized display market. This is because, unlike the small and medium-sized OLED, a large-sized OLED has expensive manufacturing cost and has large CAPEX burden.

Recently, next-generation displays to replace OLED are emerging in the large-sized display market. QD-OLED and QNED are examples of the next-generation display to replace OLED. In particular, QNED has a structure in which nanorods as nano-sized LEDs act as light sources. Since OLED has a structure in which an organic material emits light, OLED has a short lifespan and causes burn-in. However, QNED has a structure in which an inorganic LED emits light and thus has a longer lifespan.

In a process of manufacturing QNED, nanorods acting as light-emission sources are supplied (deposited) on a thin-film transistor (TFT). The supply of the nanorods is carried out by supplying a treating liquid containing the nanorods to the thin-film transistor. The nanorods supplied onto the thin-film transistor are in a randomly-oriented state in which longitudinal directions thereof are random. When the nanorods are in the randomly-oriented state, luminous efficiency and sharpness of the manufactured QNED are deteriorated. In other words, it is required to uniformly orient the nanorods supplied onto the thin-film transistor in order to increase the luminous efficiency and sharpness of QNED.

SUMMARY

Embodiments of the inventive concept provide a substrate treating apparatus capable of efficiently treating a substrate.

Further, embodiments of the inventive concept provide a substrate treating apparatus capable of manufacturing a display having high luminous efficiency and sharpness.

Further, embodiments of the inventive concept provide a substrate treating apparatus capable of uniformly orienting light-emission sources supplied onto a substrate.

Further, embodiments of the inventive concept provide a substrate treating apparatus capable of uniformly orienting light-emission sources supplied onto a substrate by applying a voltage to the substrate.

Further, embodiments of the inventive concept provide a substrate treating apparatus capable of minimizing damage to a substrate by buffering a pressure to be transferred to the substrate when a voltage is applied to the substrate.

Further, embodiments of the inventive concept provide a substrate treating apparatus capable of minimizing a risk that a substrate collides with a base of the substrate treating apparatus and thus is damaged when the substrate is loaded onto or unloaded from the substrate treating apparatus.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims and combinations thereof.

In one aspect, an apparatus for treating a substrate includes a liquid supply unit for supplying light-emission sources and/or a treating liquid onto the substrate, and a voltage application unit for applying a voltage to the substrate on which the light-emission sources have been supplied.

In one embodiment, the voltage application unit may include at least one voltage application pin in contact with the substrate to apply the voltage to the substrate.

In one embodiment, the voltage application unit further may include a shock-absorbing member for absorbing a pressure to be transferred to the substrate when the voltage application pin comes into contact with the substrate.

In one embodiment, the voltage application unit further may include a voltage application plate connected to a power source, wherein the voltage application plate, the shock-absorbing member, and the voltage application pin are electrically connected to each other.

In one embodiment, the voltage application unit further may include a body having a groove into which the voltage application pin is inserted, and a moving member for moving the voltage application pin inserted into the body.

In one embodiment, the moving member may be constructed to move the body in a vertical direction.

In one embodiment, the moving member may be constructed to move the body laterally.

In one embodiment, the moving member may be constructed to rotate the body about a rotation axis parallel to a movement direction of the substrate.

In one embodiment, the apparatus may further include a stage unit for spraying gas to a bottom face of the substrate such that the substrate is levitated, and a gripping unit for gripping the levitated substrate and moving the substrate on the stage unit, wherein the voltage application unit is installed on the gripping unit and moves together with the gripping unit.

In one embodiment, the gripping unit further may include a gripper for gripping the levitated substrate using a vacuum suction scheme.

In one embodiment, the apparatus may further include a stage unit having a substrate-supporting plate on which the substrate is seated, wherein the substrate-supporting plate and the substrate seated thereon move together, wherein the voltage application unit is installed on the stage unit and moves together with the substrate-supporting plate.

In another aspect, an apparatus for treating a substrate includes a liquid supply unit for supplying a treating liquid containing light-emission sources onto the substrate, wherein each of light-emission sources has a rod shape, and a voltage application unit for generating an electric field on the substrate to uniformly orient the light-emission sources supplied onto the substrate.

In one embodiment, the apparatus may further include a stage unit for spraying gas to a bottom face of the substrate to levitate the substrate, and a gripping unit for gripping one side of the levitated substrate and moving the gripped substrate into a space below the liquid supply unit, wherein the voltage application unit is installed on the gripping unit and moves together with the gripping unit.

In one embodiment, the gripping unit further may include a gripper for gripping a bottom face of the levitated substrate using a vacuum suction scheme.

In one embodiment, the voltage application unit may include at least one voltage application pin which is in contact with an electrode formed on the substrate and applies a voltage to the electrode to generate an electric field.

In one embodiment, the voltage application unit further may include a shock-absorbing member for absorbing a pressure to be transferred to the substrate when the voltage application pin comes into contact with the substrate.

In one embodiment, the apparatus may further include a controller, wherein the controller may control the liquid supply unit, and the voltage application unit so that the voltage application unit applies the voltage to the substrate while the liquid supply unit supplies the treating liquid onto the substrate.

In one embodiment, the apparatus may further include a controller, wherein the controller may control the liquid supply unit, and the voltage application unit so that the voltage application unit applies the voltage to the substrate after the liquid supply unit has supplied the treating liquid onto the substrate.

In still another aspect, an apparatus for treating a glass substrate includes a stage unit for spraying gas to a bottom face of the glass substrate to levitate the glass substrate, a gripping unit for gripping the levitated glass substrate using a vacuum suction scheme and moving the glass substrate on the stage unit, a liquid supply unit for supplying a treating liquid on the glass substrate using an inkjet scheme, wherein the treating liquid contains acetone and nanorods as light-emission sources, and a voltage application unit installed in the gripping unit, wherein the voltage application unit applies a voltage to the glass substrate on which the treating liquid has been supplied, thereby orienting lengthwise directions of the nanorods in a single direction.

In one embodiment, the voltage application unit may include a voltage application pin which is in contact with an electrode formed on the glass substrate and applies the voltage to the glass substrate, a shock-absorbing member electrically connected to the voltage application pin, wherein the shock-absorbing member absorbs a pressure to be transferred to the glass substrate when the voltage application pin comes into contact with the electrode, and a moving member for varying a position of the voltage application pin so that the voltage application pin selectively contacts the electrode.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
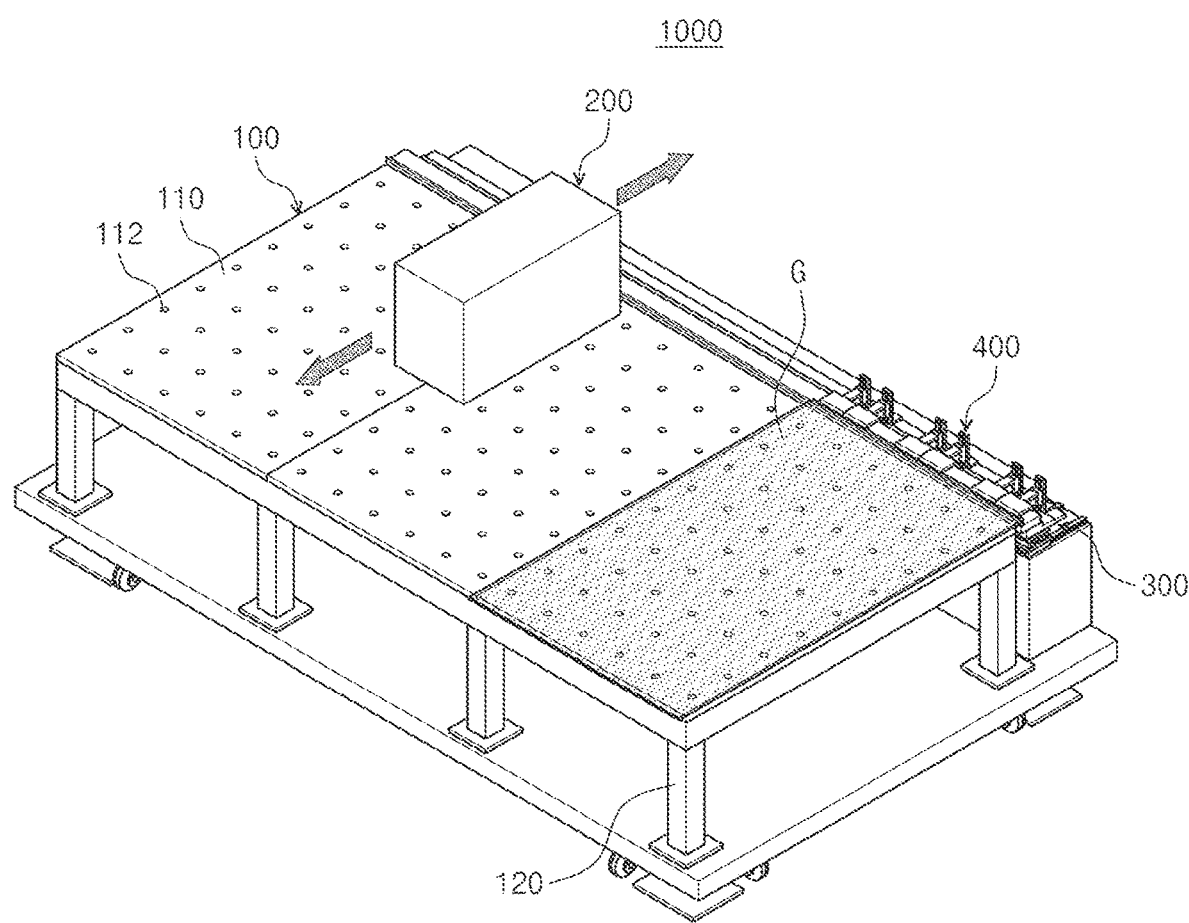
FIG. 1 is a plan view schematically showing a substrate treating apparatus according to one embodiment of the inventive concept.

Hereinafter, embodiments of the inventive concept will be described in detail with reference to the accompanying drawings so that those of ordinary skill in the art to which the inventive concept may easily implement the embodiments. However, the inventive concept may be implemented in various different forms and is not limited to the embodiments described herein. Further, in describing preferred embodiments of the inventive concept, when it is determined that a detailed description of a related known function or component may unnecessarily obscure gist of the inventive concept, the detailed description thereof will be omitted. Further, the same reference numerals are used for parts having similar functions and actions throughout the drawings.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof.

As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified. A shape, a size, a ratio, an angle, a number, etc. disclosed in the drawings for describing an embodiments of the present disclosure are exemplary, and the present disclosure is not limited thereto.

Hereinafter, embodiments of the inventive concept will be described with reference to FIG. 1 to FIG. 12.

Figure 2:
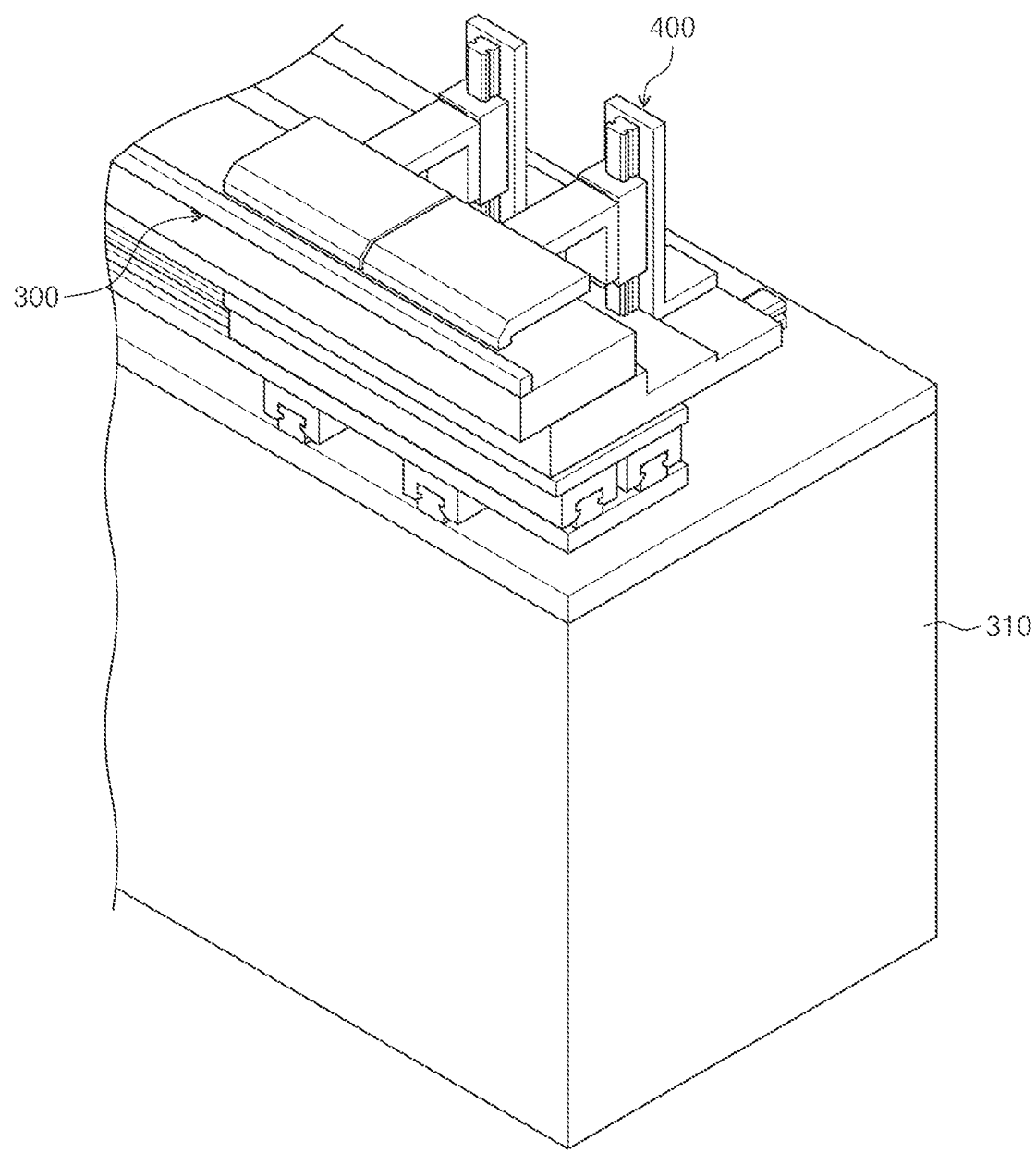
FIG. 2 is a diagram showing a gripping unit and a voltage application unit of FIG. 1.

FIG. 1 is a plan view schematically showing a substrate treating apparatus according to one embodiment of the inventive concept, and FIG. 2 is a diagram showing a gripping unit and a voltage application unit of FIG. 1. Referring to FIG. 1 and FIG. 2, a substrate treating apparatus 1000 according to one embodiment of the inventive concept may supply light-emission sources and/or a treating liquid to a substrate G to treat the substrate G. The substrate treating apparatus 1000 may supply the treating liquid containing nanorods as light-emission sources to the substrate G to treat the substrate G. Further, the substrate G may be a glass substrate.

The substrate treating apparatus 1000 may include a stage unit 100, a liquid supply unit 200, a gripping unit 300, a voltage application unit 400, and a controller (not shown).

The stage unit 1000 may levitate the substrate G. The stage unit 100 may include a stage 110, and a support structure 120. The stage 110 may be supported on the support structure 120. The stage 110 may have at least one gas spray hole 112 defined therein for spraying gas. For example, a plurality of gas spray holes 112 for spraying gas may be formed in the stage 110. The gas spray holes 112 formed in the stage 110 may be spaced apart from each other. The gas spray holes 112 formed in the stage 110 may be spaced apart from each other at an equal spacing. The gas spray holes 112 formed in the stage 110 may be spaced apart from each other and may be arranged in a grid pattern in a plan view. The gas spray hole 112 may inject the gas onto a bottom face of the substrate G loaded on the substrate treating apparatus 1000 to levitate the substrate G.

The liquid supply unit 200 may supply the treating liquid to the substrate G loaded on the substrate treating apparatus 1000. The liquid supply unit 200 may supply the treating liquid using an inkjet scheme. For example, the liquid supply unit 200 may be an inkjet head module that supplies the treating liquid using an inkjet scheme. The liquid supply unit 200 may be movable under activation of a driver (not shown). For example, the liquid supply unit 200 may move in a direction perpendicular to a moving direction of the substrate G in a top view. For example, the liquid supply unit 200 may move in left and right directions. The liquid supply unit 200 may discharge the treating liquid using an inkjet scheme while moving in the left and right directions.

The treating liquid supplied from the liquid supply unit 200 may contain the light-emission sources. For example, the treating liquid supplied from the liquid supply unit 200 may be a treating liquid obtained by mixing acetone with the light-emission sources. Each of the light-emission sources contained in the treating liquid may be embodied as a nanorod as a nano-sized LED. The nanorod may be made of mineral. The nanorod may be embodied as a nano-sized blue LED. The nanorod may have a columnar shape. The nanorod may be embodied as a core/shell structured LED.

The gripping unit 300 may grip the substrate G. The gripping unit 300 may grip the substrate G levitated by the stage unit 100. The gripping unit 300 may grip one side of the substrate G levitated by the stage unit 100. The gripping unit 300 may grip a bottom face of one side of the substrate G in a vacuum suction manner. Further, the gripping unit 300 may move the substrate G on the stage unit 100. The gripping unit 300 may move the substrate G in a straight line while gripping the substrate G. The gripping unit 300 may move the substrate G into a space below the liquid supply unit 200 while gripping the substrate G. The gripping unit 300 may linearly move the gripped substrate G within the space below the liquid supply unit 200 while the liquid supply unit 200 is supplying the treating liquid.

The voltage application unit 400 may apply a voltage to the substrate G on which the nanorods as the light-emission sources have been supplied. The voltage application unit 400 may apply the voltage to the substrate G on which the nanorods have been supplied, thereby generating an electric field on the substrate G. When the voltage application unit 400 generates the electric field on the substrate G, the nanorods supplied onto the substrate G may be oriented in a single direction.

Further, the voltage application unit 400 may be installed on the gripping unit 300. Further, at least one voltage application unit 400 may be provided. For example, a plurality of voltage application units 400 may be provided. For example, six voltage application units 400 may be provided. However, the present disclosure is not limited thereto. The number of the voltage application units 400 may be variously modified.

Figure 3:
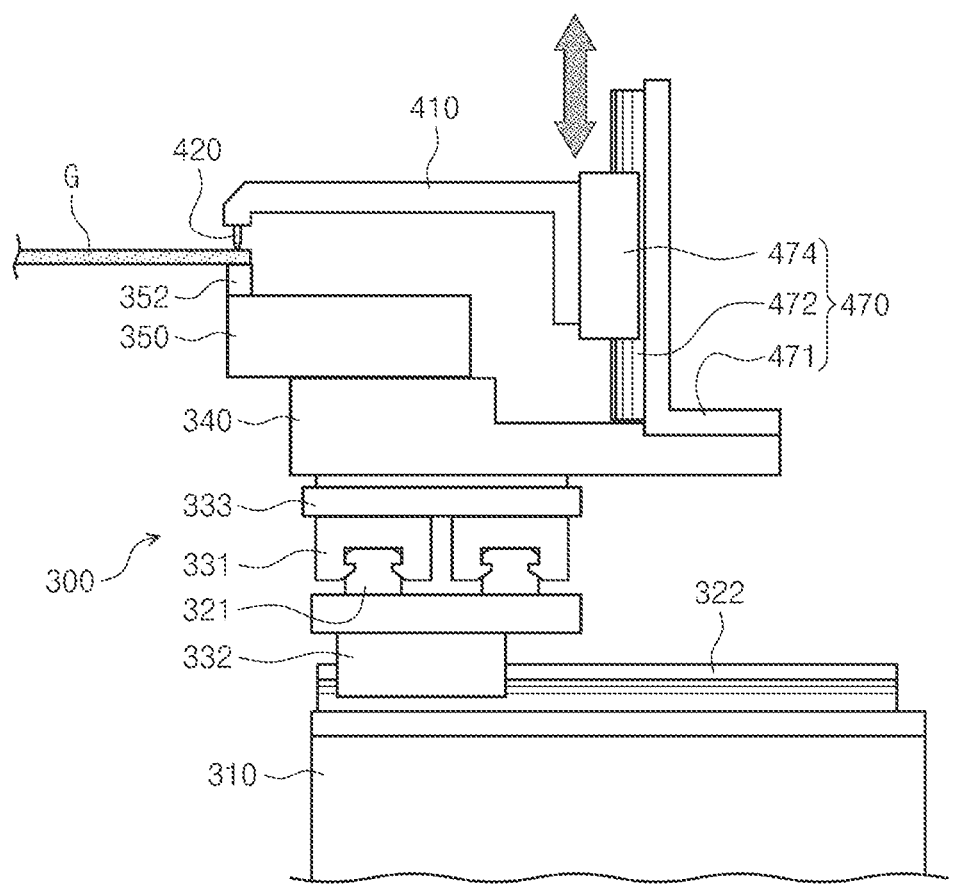
FIG. 3 is a cross-sectional view showing the gripping unit and the voltage application unit of FIG. 2.

Hereinafter, the gripping unit 300 and the voltage application unit 400 of the substrate treating apparatus 1000 according to one embodiment of the inventive concept will be described in detail with reference to FIG. 3 and FIG. 4. Further, when the plurality of voltage application units 400 are installed on the gripping unit 300, configurations of the voltage application units 400 may be the same as or similar to each other. FIG. 3 is a cross-sectional view showing the gripping unit and the voltage application unit of FIG. 2, and FIG. 4 is a diagram showing a portion of the voltage application unit of FIG. 2.

Figure 4:
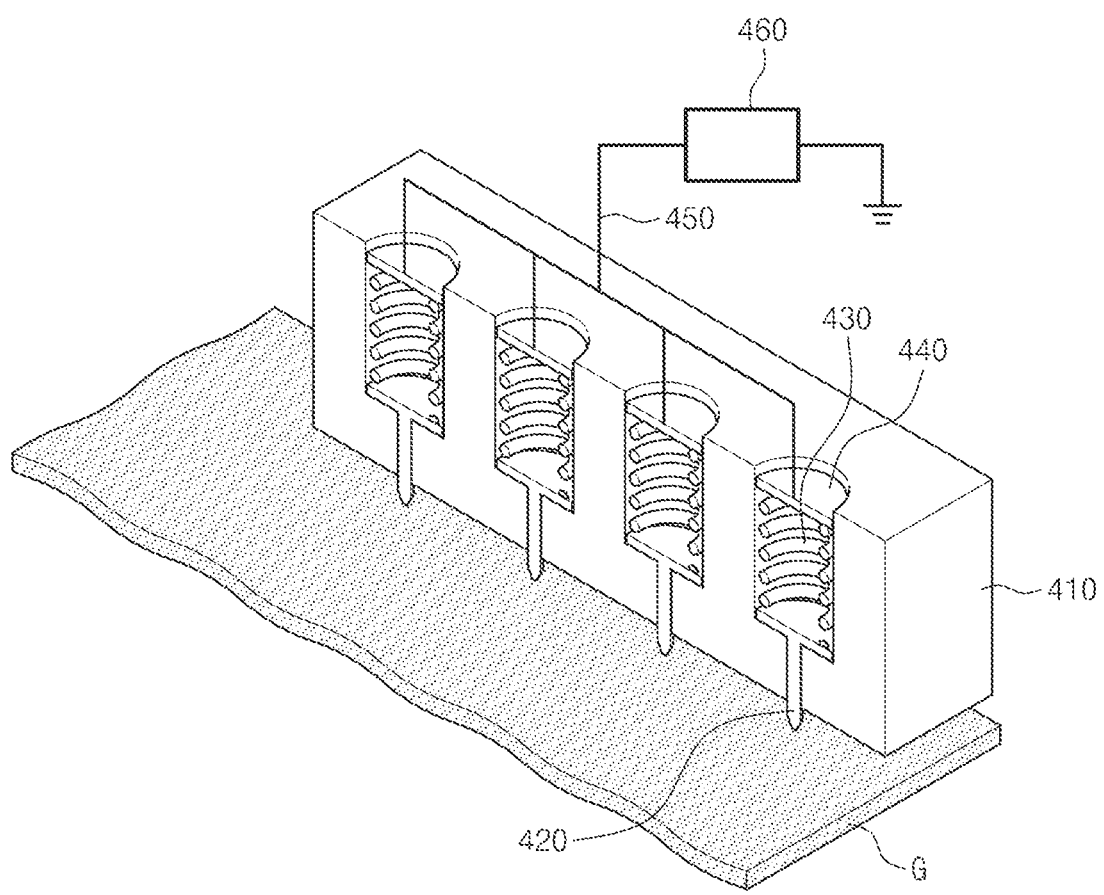
FIG. 4 is a diagram showing a portion of the voltage application unit of FIG. 2.

Referring to FIG. 3 and FIG. 4, the gripping unit 300 may include a transfer frame 310, a convey rail 321, a first movable portion 331, a second movable portion 332, a connection plate 333, a coupling frame 340, and a gripper 350.

The transfer frame 310 may support convey rails 321 and 322. The convey rails 321 and 322 may provide a travel path along which the gripper 350 travels. The convey rails 321 and 322 may include a first convey rail 321, and a second convey rail 322. The first convey rail 321 may be constructed so that a longitudinal direction thereof is parallel to a moving direction of the substrate G. The second convey rail 322 may be constructed such that a longitudinal direction thereof is perpendicular to the moving direction of the substrate G in a top view.

The first movable portion 331 may move the gripper 350 in a front/rear direction. The first movable portion 331 may be embodied as a body that moves along the first convey rail 321. The first movable portion 331 may have a groove having a shape corresponding to a shape of the first convey rail 321. At least one first movable portion 331 may be provided. For example, the number of first movable portions 331 may correspond to the number of first convey rails 321. For example, when a pair of convey rails 320 is provided, a pair of first movable portions 331 may be provided.

The second movable portion 332 may move the gripper 350 in the left/right directions. The second movable portion 332 may be embodied as a body that moves along the second convey rail 322. The second movable portion 332 may have a groove having a shape corresponding to that of the second convey rail 322.

As the gripping unit 300 has the first movable portion 331, the second movable portion 332, the first convey rail 321, and the second convey rail 322, the gripper 350 may move in the front, rear, left, and right directions. For example, when the first movable portion 331 moves in the front/rear direction, a position of the gripper 350 may also be changed in the front/rear direction. Further, when the second movable portion 332 moves in the left/right direction, the position of the gripper 350 may also be changed in the left/right direction.

The gripper 350 may be coupled to the coupling frame 340. Further, the voltage application unit 400 may be coupled to the coupling frame 340. That is, the coupling frame 340 may be embodied as a body to which the gripper 350 and the voltage application unit 400 are coupled. Further, the coupling frame 340 may be coupled to the first movable portion 331 via the connection plate 333.

The gripper 350 may grip the substrate G. The gripper 350 may grip one side of the substrate G. The gripper 350 may grip a bottom face of one side of the substrate G. Further, the gripper 350 may grip the substrate G using a vacuum suction scheme. For example, the gripper 350 may include a suction portion 352 in which at least one vacuum suction hole (not shown) is formed. The vacuum suction hole formed in the suction portion 352 suctions the bottom face of one side of the substrate G. Therefore, even when the substrate G is levitated on the stage unit 100, a vertical level thereof may be kept constant. Further, since the gripper 350 may move linearly while suctioning the bottom face of the substrate G, the gripper 350 may move the substrate G in the front/rear direction.

The voltage application unit 400 may apply the voltage to the substrate G. The voltage application unit 400 may include a body 410, a voltage application pin 420, a shock-absorbing member 430, a voltage application plate 440, a voltage application line 450, a power supply 460, and a moving member 470.

The body 410 may have a generally 'inversed L' shape in a cross-sectional view. The body 410 may have a generally curved plate shape. The voltage application pin 420 may be disposed at a free end of the body 410. For example, a groove into which the voltage application pin 420 is inserted may be formed in the body 410.

The voltage application pin 420 may be in contact with the substrate G to apply the voltage to the substrate G. The voltage application pin 420 may be in contact with an electrode formed on the substrate G, and thus may apply the voltage to the electrode to apply the voltage to the substrate G. The voltage application pin 420 may be in contact with the electrode formed on the substrate G, and thus may apply the voltage to the electrode to generate an electric field on the substrate G. The voltage application pin 420 may include a head which is caught in the groove formed in the body 410 to prevent the voltage application pin 420 from being removed from the body 410, and a contact portion extending downward from the head.

Further, the voltage application unit 400 may further include the shock-absorbing member 430. The shock-absorbing member 430 may be disposed between the head of the voltage application pin 420 and the voltage application plate 440. The voltage application plate 440 may be embodied as a plate connected to the voltage application line 450 connected to the power supply 460. The shock-absorbing member 430 may absorb a pressure to be transferred to the substrate G when the voltage application pin 420 comes into contact with a top face of the substrate G. For example, the shock-absorbing member 430 may be embodied as a spring.

Further, each of the voltage application pin 420, the shock-absorbing member 430, and the voltage application plate 440 may be made of a conductive material. The voltage application pin 420, the shock-absorbing member 430, and the voltage application plate 440 may be electrically connected to each other. Accordingly, when the power supply 460 applies the voltage to the voltage application plate 440, the applied voltage may be transmitted to the voltage application pin 420 through the shock-absorbing member 430. Further, the voltage application pin 420 may be disposed at a position corresponding to a position of the suction portion 352 of the gripper 350 as described above.

The moving member 470 may move the voltage application pin 420. For example, the moving member 470 may move the body 410 into which the voltage application pin 420 is inserted. The moving member 470 may move the body 410 upwardly and downwardly. In one example, the moving member 470 may include a vertical frame 471, a vertical rail 472, and a vertical movable portion 474. The vertical frame 471 may be a component fixed to the coupling frame 340 as described above. The vertical rail 472 extending in a vertical direction may be installed on the vertical frame 471. The vertical movable portion 474 may be disposed on the vertical rail 472. The vertical movable portion 474 may be combined with the body 410. The vertical movable portion 474 may move in the vertical direction along the vertical rail 472. Accordingly, the body 410 coupled to the vertical movable portion 474 may move in the vertical direction. As the body 410 is constructed to be movable in the vertical direction, the voltage application pin 420 inserted into the body 410 may selectively contact the top face of the substrate G.

Figure 5:
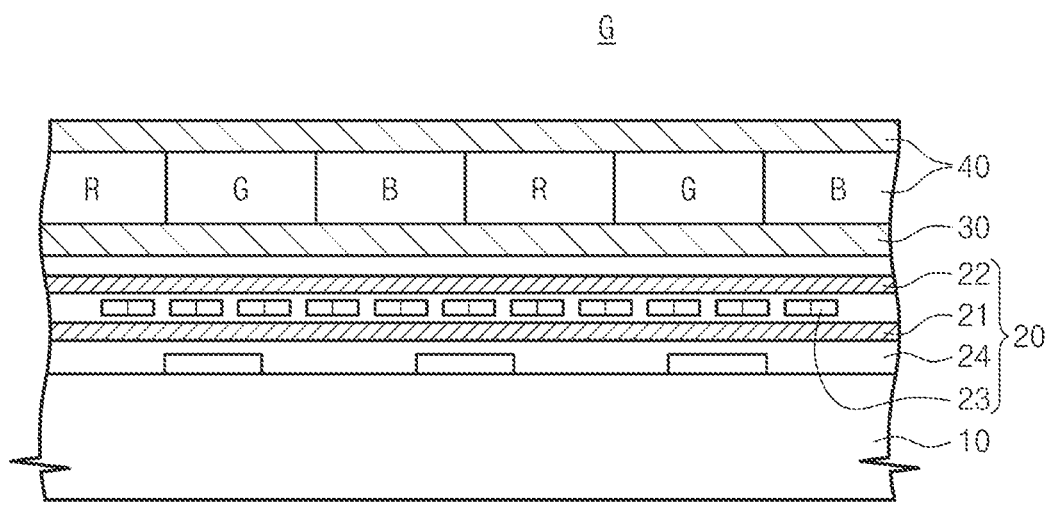
FIG. 5 is a cross-sectional view showing an example of a substrate treated by the substrate treating apparatus of FIG. 1.

FIG. 5 is a cross-sectional view showing an example of a substrate treated by the substrate treating apparatus of FIG. 1. Referring to FIG. 5, the substrate G manufactured via the treatment using the substrate treating apparatus 1000 according to one embodiment of the inventive concept may include a thin-film transistor layer 10, a light-emitting layer 20, a polarization layer 30, and a color filter layer 40.

The thin-film transistor layer 10 may be made of a material such as In, Ga, Zn, oxide, or the like. A structure of the thin-film transistor layer 10 shown in FIG. 5 is only an example. The structure of the thin-film transistor layer 10 may be variously modified into known structures of the thin-film transistor layer 10.

The light-emitting layer 20 may refer to a layer in which the above-described light-emission sources, that is, the nanorods 23 emit light. The light-emitting layer 20 may include a first electrode 21, a second electrode 22, and an insulating layer 24. The nanorods 23 may be disposed between the first electrode 21 and the second electrode 22.

The first electrode 21 may be formed on the thin-film transistor layer 10. The first electrode 21 may be formed by depositing a material such as ITO, Al, Ti, or Au using physical vapor deposition (PVD) and then by etching the deposited material via a wet etch process. Further, the first electrode 21 may act as an electrode in contact with the voltage application pin 420 as described above.

The insulating layer 24 may be made of a material such as SiN or $SiO_2$ and may be deposited via chemical vapor deposition (CVD).

The second electrode 22 may be disposed above the nanorods 23. The second electrode 22 may be formed by depositing a material such as Ti/Au or ITO using PVD (physical vapor deposition), followed by exposure/etching. Further, the second electrode 22 may act as an electrode for activating the nanorods 23.

The polarization layer 30 may polarizes light generated from the nanorods 23.

The color filter layer 40 may impart R, G, and B colors to the light generated from the nanorods 23. For example, when the nanorods 23 are blue LEDs of a nano size, the color filter layer 40 may serve to impart R, G, and B colors to blue light generated from the nanorods 23 as the blue LEDs.

The substrate treating apparatus 1000 according to one embodiment of the inventive concept may supply the treating liquid containing the nanorods 23 onto the first electrode 21 of the substrate G as described above and may uniformly orient length directions of the nanorods 23 supplied onto the first electrode 21.

Hereinafter, a method of supplying the nanorods 23 to the substrate G and uniformly orienting the supplied nanorods 23 using the substrate treating apparatus 1000 according to one embodiment of the inventive concept will be described. The controller may control the substrate treating apparatus 1000 to perform a substrate treating method as described below. For example, the controller may control the liquid supply unit 200 and the voltage application unit 400 such that the voltage application unit 400 applies the voltage to the substrate G while the liquid supply unit 200 supplies the treating liquid onto the substrate G. Alternatively, the controller may control the liquid supply unit 200 and the voltage application unit 400 so that the voltage application unit 400 applies the voltage on the substrate G after the liquid supply unit 200 has supplied the treating liquid onto the substrate G.

Figure 6:
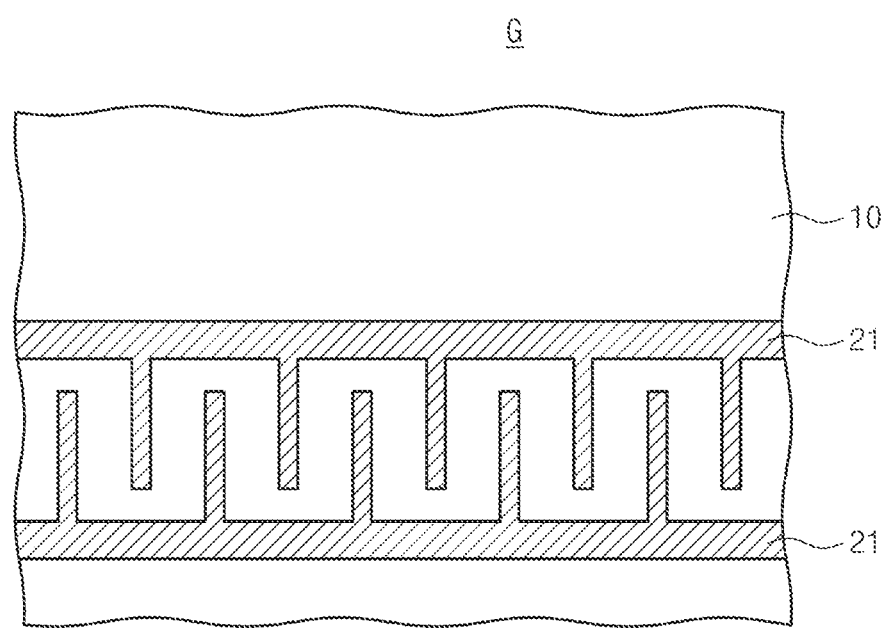
FIG. 6 is a top view of an example of a substrate to be treated by the substrate treating apparatus of FIG. 1.

For example, as shown in FIG. 6, the first electrode 21 may be formed on the thin-film transistor layer 10. The substrate G on which the first electrode 21 is formed may be loaded onto the substrate treating apparatus 1000. The substrate G loaded onto the substrate treating apparatus 1000 may be levitated by the gas sprayed from the stage unit 100, and the levitated substrate G may be gripped by the gripping unit 300. Further, the gripping unit 300 may move the levitated substrate G into a space below the liquid supply unit 200.

Figure 7:
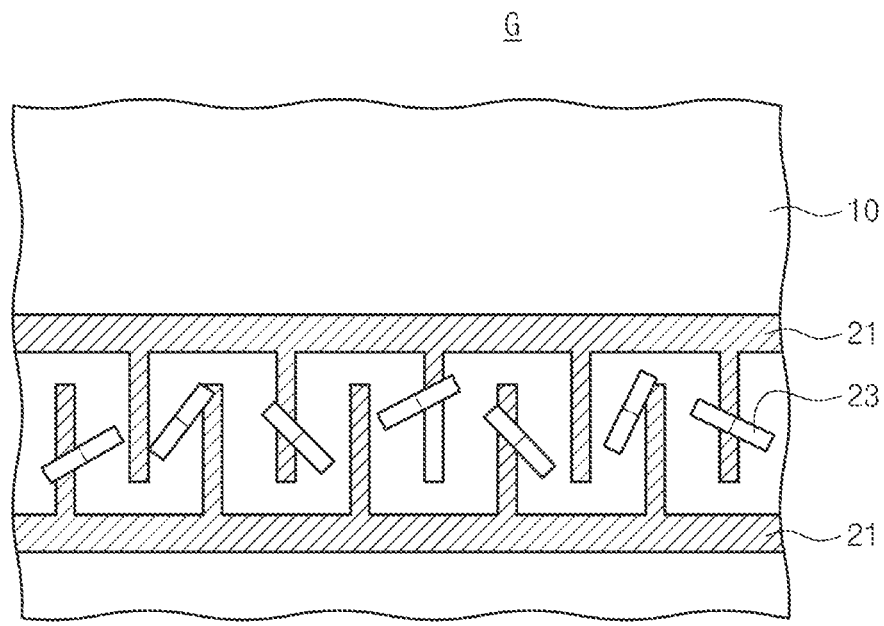
FIG. 7 is a diagram showing a state in which light-emission sources have been supplied onto the substrate of FIG. 6.

When the substrate G has moved to the space below the liquid supply unit 200, the liquid supply unit 200 may supply the treating liquid to the substrate G. The treating liquid supplied from the liquid supply unit 200 may be a liquid obtained by mixing the nanorods 23 with acetone. When the treating liquid is supplied onto the substrate G, the nanorods 23 are in a randomly-oriented state as shown in FIG. 7. When the nanorods 23 are in the randomly-oriented state, the luminous efficiency and sharpness of the manufactured display such as QNED is reduced. This is because, when the nanorods 23 are in the randomly-oriented state, light beams respectively generated from the nanorods 23 interfere with each other. Therefore, it is very important to orient the nanorods 23 in a single direction.

Figure 8:
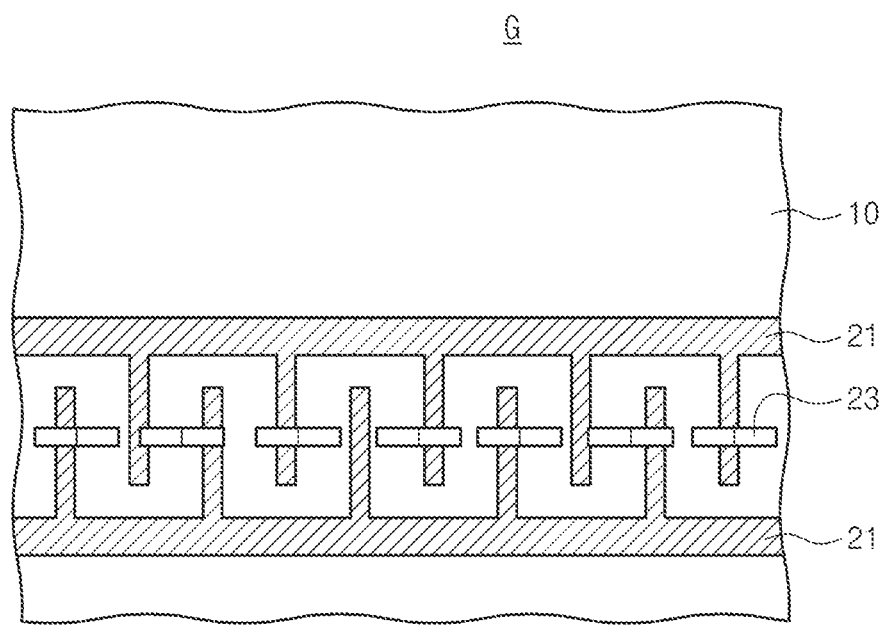
FIG. 8 is a diagram showing a state in which the light-emission sources are uniformly oriented when the voltage has applied to the substrate of FIG. 7.

In the substrate treating apparatus 1000 according to one embodiment of the inventive concept, the voltage application pin 420 is in contact with the first electrode 21 of the substrate G, and the voltage application pin 420 applies the voltage to the first electrode 21. When the voltage application pin 420 applies the voltage to the first electrode 21, an electric field is generated on the substrate G. The generated electric field orients the nanorods 23 in a single direction as shown in FIG. 8. When the nanorods 23 are uniformly oriented, the light beams respectively generated from the nanorods 23 do not interfere with each other, so that the luminous efficiency and sharpness of the manufactured display may be improved.

Further, as described above, the voltage application unit 400 includes the shock-absorbing member 430. Accordingly, when the voltage application pin 420 comes into contact with the first electrode 21, the shock-absorbing member 430 may absorb the pressure to be applied to the first electrode 21, thereby minimizing damage to the substrate G, specifically, to the first electrode 21.

Figure 9:
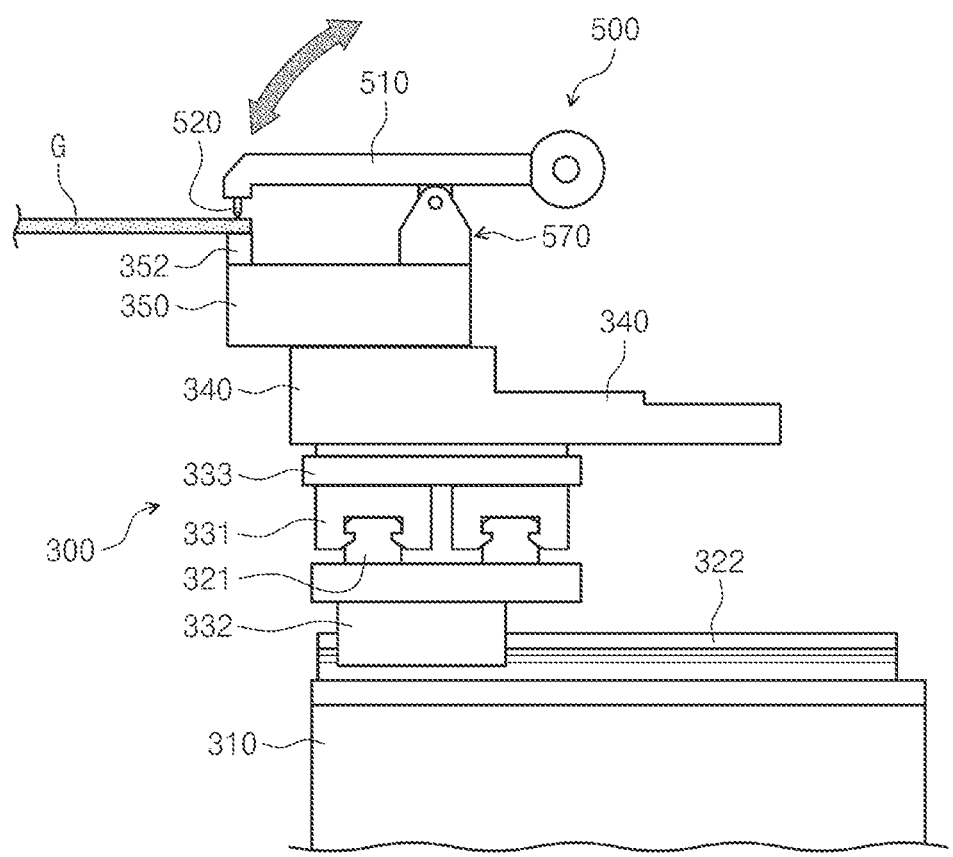
FIG. 9 is a cross-sectional view showing a voltage application unit according to another embodiment of the inventive concept.

FIG. 9 is a cross-sectional view showing a voltage application unit according to another embodiment of the inventive concept. A configuration of a voltage application unit 500 shown in FIG. 9 is the same as or similar to the configuration of the voltage application unit 400 as described above, except for a configuration as described below.

The voltage application unit 500 may include a moving member 570 that may allow a voltage application pin 520 to selectively contact the substrate G. The moving member 570 may be configured to rotate a body 510 about an axis of rotation parallel to a direction of movement of the substrate G. That is, since the body 510 is rotatable about the rotation axis, a risk that the substrate G collides with the body 510 when the substrate G is loaded on or unloaded from the stage unit 100 may be further reduced.

Figure 10:
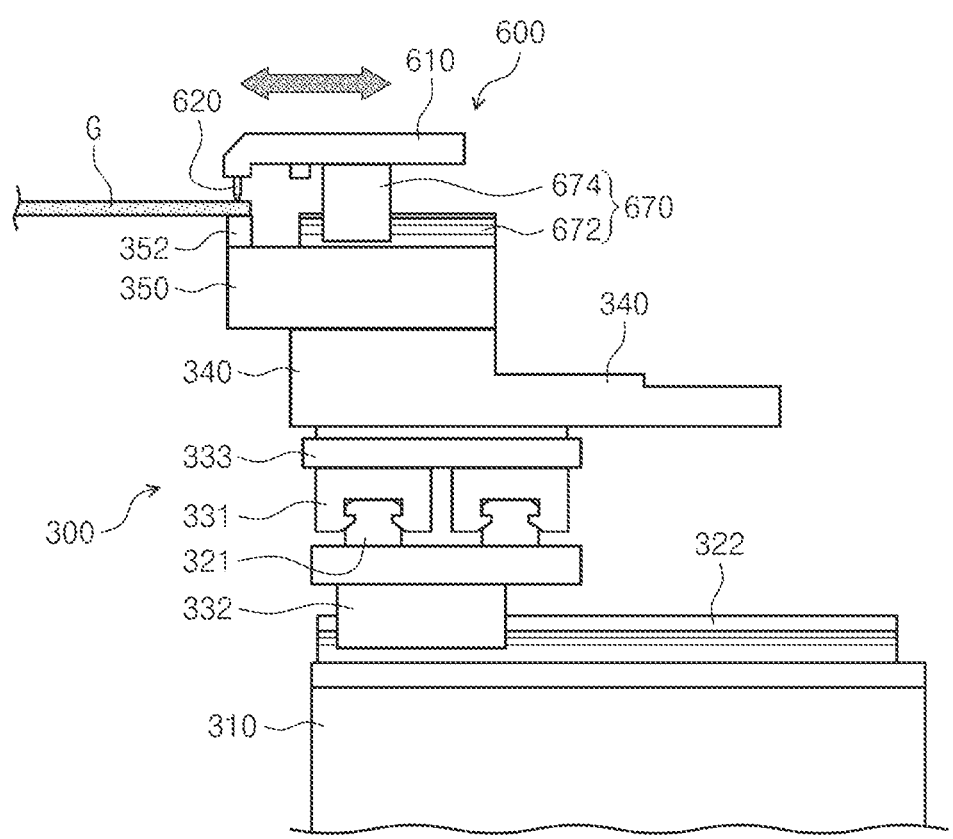
FIG. 10 is a cross-sectional view showing a voltage application unit according to still another embodiment of the inventive concept.

FIG. 10 is a cross-sectional view showing a voltage application unit according to still another embodiment of the inventive concept. A configuration of a voltage application unit 600 shown in FIG. 10 is the same as or similar to the configuration of each of the voltage application units 400 and 500 as described above, except for a configuration as described below. The voltage application unit 600 may include a moving member 670 that may allow a voltage application pin 620 to selectively contact the substrate G. The moving member 670 may include a horizontal rail 672 installed on the gripper 350, and a horizontal movable portion 674 that moves along the horizontal rail 672. A body 610 may be coupled to the horizontal movable portion 674. That is, the moving member 670 may move the body 610 in a lateral direction, more specifically, may move the body 610 in a left and right direction that is perpendicular to a moving direction of the substrate G in a top view. That is, the body 610 may be movable in the left and right directions. Thus, when the substrate G is loaded on or unloaded from the stage unit 100, a risk that the substrate G collides with the body 610 may be further reduced.

Figure 11:
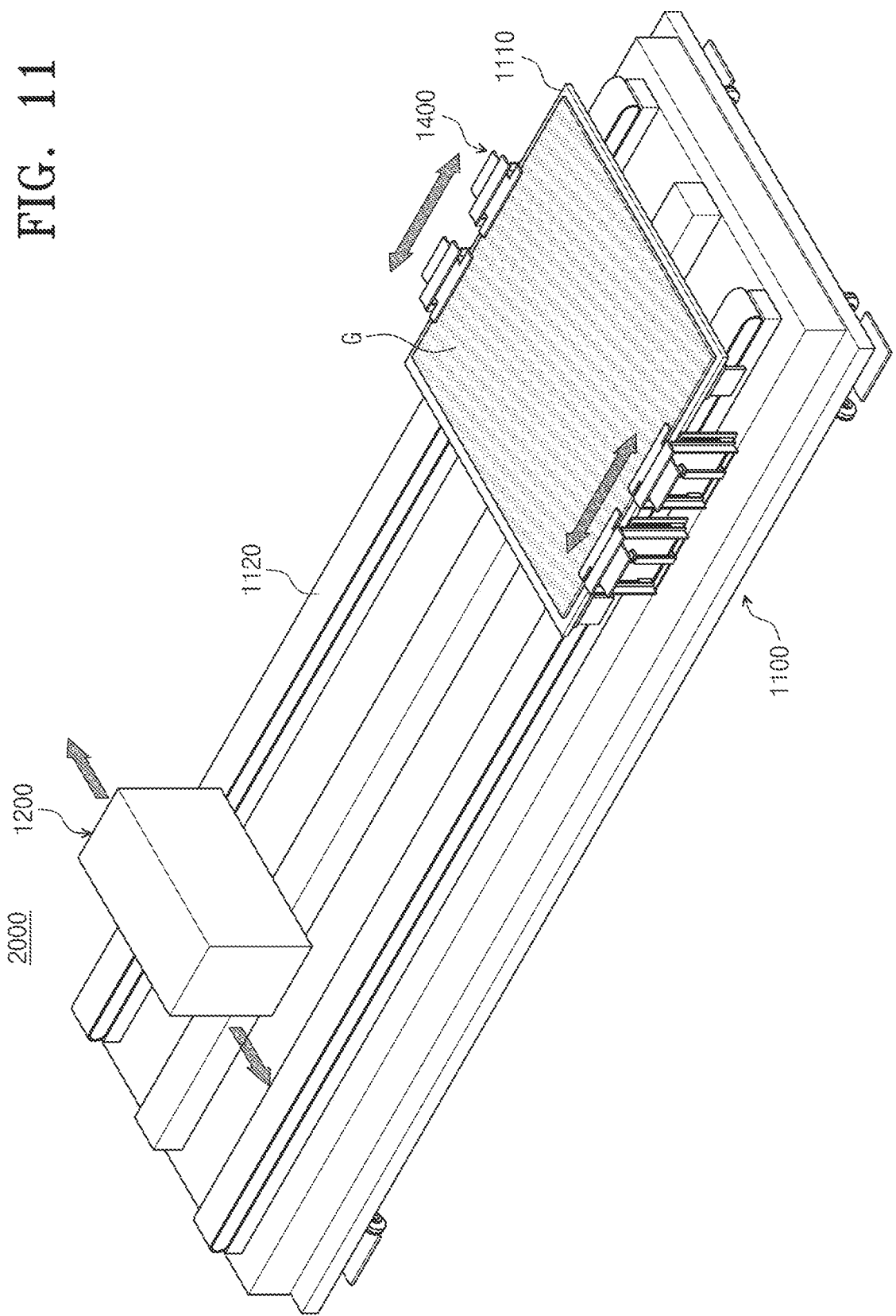
FIG. 11 is a view showing a substrate treating apparatus according to another embodiment of the inventive concept.

In the above-described example, a case in which the stage unit 100 injects the gas to a bottom face of the substrate G to levitate the substrate G is described by way of example. The stage unit 100 may levitate the substrate G in a non-contact manner, thereby reducing generation of particles and static electricity. However, embodiments of the inventive concept are not limited thereto. For example, as shown in FIG. 11, a substrate treating apparatus 2000 according to another embodiment of the inventive concept may include a stage unit 1100, a liquid supply unit 1200, and a voltage application unit 1400. A configuration and a function of the liquid supply unit 1200 are the same as or similar to those of the above-described liquid supply unit 200, and thus redundant description thereof will be omitted.

The stage unit 1100 may include a substrate-supporting plate 1110 and a convey rail 1120. The substrate-supporting plate 1110 provides a surface on which substrate G is mounted. A vacuum suction hole may be formed in the substrate-supporting plate 1110, so that the substrate G may be gripped by the substrate-supporting plate 1110 in a vacuum suction scheme. Further, the substrate-supporting plate 1110 may move linearly along the convey rail 1120 in forward/rearward directions. The substrate-supporting plate 1110 moves along the convey rail 1120 so that the substrate G may move to the space below the liquid supply unit 1200.

Further, the voltage application unit 1400 may be installed on the stage unit 1100. For example, the voltage application unit 1400 may be installed on the stage unit 1100 and thus may move together with a mounting plate 1110. A configuration of the voltage application unit 1400 is the same as the configuration of each of the voltage application units 400, 500, and 600 as described above, except for a configuration as described below.

Figure 12:
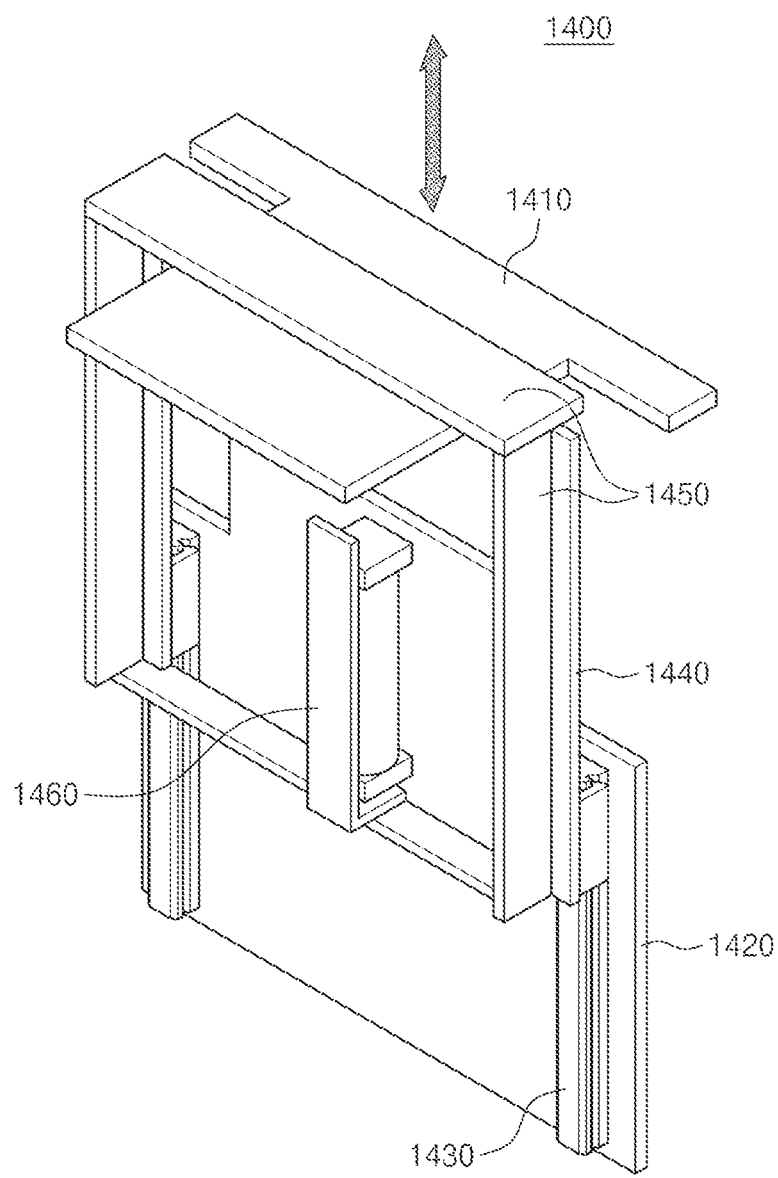
FIG. 12 is a diagram showing a voltage application unit of FIG. 11.

FIG. 12 is a diagram showing a voltage application unit of FIG. 11. Referring to FIG. 12, the voltage application unit 1400 may include a body 1410, a coupling plate 1420, a vertically-extending rail 1430, a vertically-moving plate 1440, fixed plates 1450, and a vertical moment driver 1460. A configuration of the body 1410 differs from the configurations of each of the above-described bodies 410, 510, and 610 only in a shape of a portion thereof, and thus redundant description thereof will be omitted. The coupling plate 1420 may be coupled to a stage unit 1100. The vertically-extending rail 1430 that provides a path along which the body 1410 vertically moves may be installed on the coupling plate 1420. At least one vertically-extending rail 1430 may be provided. For example, a pair of the vertically-extending rail 1430 may be provided. The vertically-moving plate 1440 is constructed to be movable in the vertical direction along the vertically-extending rail 1430. The vertically-moving plate 1440 may move in the vertical direction using a driving force generated from the vertical moment driver 1460. Further, the above-described body 1410 may be coupled to the vertically-moving plate 1440. For example, the body 1410 may be fixedly coupled to the vertically-moving plate 1440 via the fixing plates 1450.

According to one embodiment of the inventive concept, the substrate may be treated efficiently.

Further, according to one embodiment of the inventive concept, the display with high luminous efficiency and sharpness may be realized.

Further, according to one embodiment of the inventive concept, the light-emission sources supplied onto the substrate may be uniformly oriented.

Further, according to one embodiment of the inventive concept, the light-emission sources supplied onto the substrate may be uniformly oriented by applying the voltage to the substrate.

Further, according to one embodiment of the inventive concept, the occurrence of damage to the substrate may be minimized by buffering the pressure to be transferred to the substrate when the voltage is applied to the substrate.

Further, according to one embodiment of the inventive concept, the risk that the substrate collides with the substrate treating apparatus and thus is damaged when the substrate is loaded onto or unloaded from the substrate treating apparatus may be minimized.

Effects of the present disclosure are not limited to the above-mentioned effects, and other effects as not mentioned will be clearly understood by those skilled in the art from the above descriptions.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
   a sprayer for supplying light-emission sources and/or a treating liquid onto the substrate;
   a pin holder for applying a voltage to the substrate on which the light-emission sources have been supplied; and
   a vacuum holder disposed entirely below a bottom surface of the substrate for gripping and moving the substrate;
   wherein the pin holder is installed above the vacuum holder to move together with the vacuum holder.

2. The apparatus of claim 1, wherein the pin holder includes at least one voltage application pin in contact with the substrate to apply the voltage to the substrate.

3. The apparatus of claim 2, wherein the pin holder further includes a spring for absorbing a pressure to be transferred to the substrate when the at least one voltage application pin comes into contact with the substrate.

4. The apparatus of claim 3, wherein the pin holder further includes a voltage application plate connected to a power source, and
   wherein the voltage application plate, the spring, and the at least one voltage application pin are electrically connected to each other.

5. The apparatus of claim 2, wherein the pin holder further includes:
   a body having a groove into which the at least one voltage application pin is inserted; and
   a driver that moves the at least one voltage application pin inserted into the body.

6. The apparatus of claim 5, wherein the driver is constructed to move the body in a vertical direction.

7. The apparatus of claim 5, wherein the driver is constructed to move the body laterally.

8. The apparatus of claim 5, wherein the driver is constructed to rotate the body about a rotation axis parallel to a movement direction of the substrate.

9. The apparatus of claim 1, wherein the apparatus further comprises:
   a stage unit for spraying gas to a bottom face of the substrate such that the substrate is levitated,
   wherein the vacuum holder grips the levitated substrate to move the substrate on the stage unit.

10. The apparatus of claim 9, wherein the vacuum holder includes a gripper for gripping the levitated substrate using a vacuum suction scheme.

11. The apparatus of claim 1, wherein the apparatus further comprises a stage unit having a substrate-supporting plate on which the substrate is seated,
    wherein the substrate-supporting plate and the substrate seated thereon move together, and
    wherein the pin holder is installed on the stage unit and moves together with the substrate-supporting plate.

12. An apparatus for treating a substrate, the apparatus comprising:
    a sprayer for supplying a treating liquid containing light-emission sources onto the substrate, wherein each of light-emission sources has a rod shape;
    a pin holder for generating an electric field on the substrate to uniformly orient the light-emission sources supplied onto the substrate; and
    a vacuum holder disposed entirely below a bottom surface of the substrate for gripping and moving the substrate;
    wherein the pin holder is installed above the vacuum holder to move together with the vacuum holder, such that, in a plan view, the pin holder overlaps with the vacuum holder.

13. The apparatus of claim 12, wherein the apparatus further comprises:
    a stage unit for spraying gas to a bottom face of the substrate to levitate the substrate,
    wherein the vacuum holder grips one side of the levitated substrate and moves the gripped substrate into a space below the sprayer.

14. The apparatus of claim 12, wherein the vacuum holder includes a gripper for gripping a bottom face of the substrate, while being levitated, using a vacuum suction scheme.

15. The apparatus of claim 12, wherein the pin holder includes at least one voltage application pin which is in contact with an electrode formed on the substrate and applies a voltage to the electrode to generate an electric field.

16. The apparatus of claim 15, wherein the pin holder further includes a spring for absorbing a pressure to be transferred to the substrate when the at least one voltage application pin comes into contact with the substrate.

17. The apparatus of claim 12, wherein the apparatus further comprises a controller, and
wherein the controller is configured to control the sprayer, and the pin holder so that the pin holder applies a voltage to the substrate while the sprayer supplies the treating liquid onto the substrate.

18. The apparatus of claim 12, wherein the apparatus further comprises a controller, and
wherein the controller is configured to control the sprayer, and the pin holder so that the pin holder applies a voltage to the substrate after the sprayer has supplied the treating liquid onto the substrate.

19. An apparatus for treating a glass substrate, the apparatus comprising:
a stage unit for spraying gas to a bottom face of the glass substrate to levitate the glass substrate;
a vacuum holder for gripping the levitated glass substrate using a vacuum suction scheme and moving the glass substrate on the stage unit;
a sprayer for supplying a treating liquid on the glass substrate using an inkjet scheme, wherein the treating liquid contains acetone and nanorods as light-emission sources; and
a pin holder installed above the vacuum holder, wherein the pin holder applies a voltage to the glass substrate on which the treating liquid has been supplied, thereby orienting lengthwise directions of the nanorods in a single direction.

20. The apparatus of claim 19, wherein the pin holder includes:
a voltage application pin which is in contact with an electrode formed on the glass substrate and applies the voltage to the glass substrate;
a spring electrically connected to the voltage application pin, wherein the spring absorbs a pressure to be transferred to the glass substrate when the voltage application pin comes into contact with the electrode; and
a driver that changes a position of the voltage application pin so that the voltage application pin selectively contacts the electrode.

* * * * *